(12) United States Patent
Vuillermet et al.

(10) Patent No.: US 9,797,746 B2
(45) Date of Patent: Oct. 24, 2017

(54) SYSTEMS AND METHODS FOR DETECTING A MAGNETIC TARGET BY COMPUTING A BARYCENTER

(71) Applicant: Allegro MicroSystems, LLC, Worcester, MA (US)

(72) Inventors: Yannick Vuillermet, La Motte Servolex (FR); Andreas P. Friedrich, Metz-Tessy (FR); Andrea Foletto, Annecy (FR)

(73) Assignee: Allegro MicroSystems, LLC, Worcester, MA (US)

( * ) Notice: Subject to any disclaimer, the term of this patent is extended or adjusted under 35 U.S.C. 154(b) by 310 days.

(21) Appl. No.: 14/580,814

(22) Filed: Dec. 23, 2014

(65) Prior Publication Data

US 2016/0178400 A1    Jun. 23, 2016

(51) Int. Cl.
*G01R 33/02*  (2006.01)
*G01D 5/14*   (2006.01)
*G01R 33/00*  (2006.01)
G05G 9/047    (2006.01)

(52) U.S. Cl.
CPC ......... *G01D 5/145* (2013.01); *G01R 33/0005* (2013.01); *G01R 33/02* (2013.01); *G05G 9/047* (2013.01)

(58) Field of Classification Search
CPC .... G01D 5/145; G01G 9/047; G01R 33/0005; G01R 33/02; G01R 33/06; G01R 33/07; G01R 33/10
USPC ............ 324/207.22, 207.23, 207.24, 207.25, 324/207.26, 245
See application file for complete search history.

(56) References Cited

U.S. PATENT DOCUMENTS

| 6,131,457 A | 10/2000 | Sato |
| 6,288,533 B1 | 9/2001 | Haeberli et al. |
| 6,850,269 B2 | 2/2005 | Maguire |
| 7,932,718 B1 | 4/2011 | Wiegert |
| 8,575,929 B1 | 11/2013 | Wiegert |
| 2006/0038557 A1* | 2/2006 | Johnson ................. G01D 5/145 324/207.25 |
| 2008/0184799 A1 | 8/2008 | Phan Le et al. |
| 2009/0267594 A1* | 10/2009 | Kather ..................... G01B 7/30 324/207.25 |

(Continued)

OTHER PUBLICATIONS

Office Action gated Aug. 18, 2015; for U.S. Appl. No. 13/960,910; 22 pages.

(Continued)

*Primary Examiner* — Jeff Natalini
*Assistant Examiner* — Steven Yeninas
(74) *Attorney, Agent, or Firm* — Daly, Crowley, Mofford & Durkee, LLP

(57) ABSTRACT

Systems and methods for detecting a magnetic target include a plurality of magnetic field sensing elements arranged about a central point. Each one of the plurality of magnetic field sensing elements is configured to measure a magnetic field produced by a magnetic target and provide a respective output signal that represents a respective measurement of a strength of the magnetic field. A processor circuit is coupled to receive the output signal from each one of the plurality of magnetic field sensing elements and determine a barycenter of the measurements of the magnetic field based on a position of the magnetic field sensing elements.

24 Claims, 9 Drawing Sheets

(56) References Cited

U.S. PATENT DOCUMENTS

| | | |
|---|---|---|
| 2011/0298447 A1 | 12/2011 | Foletto et al. |
| 2012/0280679 A1 | 11/2012 | Shelton |
| 2013/0147642 A1 | 6/2013 | Rubio et al. |
| 2015/0042320 A1* | 2/2015 | Cadugan ............... G01R 33/06 324/207.2 |
| 2015/0137797 A1* | 5/2015 | Ausserlechner ....... G01D 5/145 324/207.2 |

OTHER PUBLICATIONS

Analog Devices Circuit Note CN-0323; Magnetoresistive Angle Measurement; Oct. 2013; 6 pages.

Response filed on Nov. 11, 2015 to Office Action dated Aug. 18, 2015; for U.S. Appl. No. 13/960,910, 12 pages.

Final Office Action dated Jan. 7, 2016; for U.S. Appl. No. 13/960,910; 20 pages.

Response filed on Apr. 4, 2016 to the Office Action dated Jan. 7, 2016; for U.S. Appl. No. 13/960,910; 12 pages.

Advisory Action dated Apr. 20, 2016, for U.S. Appl. No. 13/960,910; 5 pages.

Response with RCE filed on Jun. 7, 2016 to the Final Office Action dated Jan. 7, 2016; for U.S. Appl. No. 13/960,910; 15 pages.

Non-Final Office Action dated Jul. 1, 2016; for U.S. Appl. No. 13/960,910; 22 pages.

Response filed Sep. 9, 2016 to Non-Final Office Action dated Jul. 1, 2016; for U.S. Appl. No. 13/960,910; 11 pages.

Final Office Action dated Sep. 28, 2016; for U.S. Appl. No. 13/960,910; 27 pages.

Response to Office Action filed on Dec. 28, 2016 for U.S. Appl. No. 13/960,910, 11 pages.

Response filed on Jan. 20, 2017 to the Final Office Action dated Sep. 28, 2016; for U.S. Appl. No. 13/960,910; 12 pages.

Applicant Initiated Interview Summary dated Jan. 27, 2017; for U.S. Appl. No. 13/960,910; 4 pages.

Notice of Allowance dated Jan. 30, 2017 for U.S. Appl. No. 13/960,910; 12 Pages.

* cited by examiner

SYSTEMS AND METHODS FOR DETECTING A MAGNETIC TARGET BY COMPUTING A BARYCENTER

FIELD

This disclosure relates to sensing a magnetic target and, more particularly, to sensing a location of a magnetic target with multiple magnetic field sensing elements.

BACKGROUND

Magnetic field sensors are used to detect the position of magnetic targets. Such sensors are often used in the detection of speed and position of a magnetic moving object, or a moving object that has one or more magnetic elements mounted to it. For example, a magnet placed on a rotating wheel or shaft will produce a magnetic field. As the wheel or shaft spins, the magnetic target will also spin and change position. A magnetic field sensor placed near the wheel or shaft generates a signal that represents a detected magnetic field, which can be used to compute speed of rotation, current position, direction of rotation and other parameters associated with the wheel or shaft.

SUMMARY

In an embodiment, a system comprises a plurality of magnetic field sensing elements arranged about a central point. Each one of the plurality of magnetic field sensing elements is configured to measure a magnetic field or a component of the magnetic field produced by a magnetic target object and provide a respective output signal that represents a respective measurement of a strength of the magnetic field. A processor circuit is coupled to receive the output signal from each one of the plurality of magnetic field sensing elements and determine a barycenter of the measurements of the magnetic field based on a position of the magnetic field sensing elements.

In another embodiment, a method of detecting a position of a magnetic target object includes measuring, by each one of a plurality of magnetic field sensing elements arranged about a central point, a magnetic field produced by a magnetic target object. Each one of the plurality of magnetic field sensing elements may provide a respective output signal that represents a respective measurement of a strength of the magnetic field. A processor coupled to receive the output signal from each of the plurality of magnetic field sensing elements determines a barycenter of the measurements of the magnetic field.

In another embodiment, a system comprises a plurality of magnetic field sensing elements arranged on a die about a central point. Each one of the plurality of magnetic field sensing elements is configured to measure a magnetic field produced by a magnetic target object and provide a respective output signal that represents a respective measurement of a strength of the magnetic field. A processor circuit is coupled to receive the output signals from each one of the plurality of magnetic field sensing elements. The processor is configured to calculate a respective weighted position vector for each magnetic field sensing element. Each respective weighted position vector may include a respective magnitude representing a respective strength of the measured magnetic field, and a respective direction representing a respective position of a respective one of the plurality of magnetic field sensing elements. The processor is also configured to calculate a barycenter by summing the measurement vectors, to calculate an offset angle of the magnetic target with respect to a reference position by calculating an offset angle of the barycenter with respect to the reference position, and to calculate a distance of the magnetic target from the central point by calculating a distance of the barycenter from the central point and multiplying the distance of the barycenter from the central point by a predetermined scalar.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
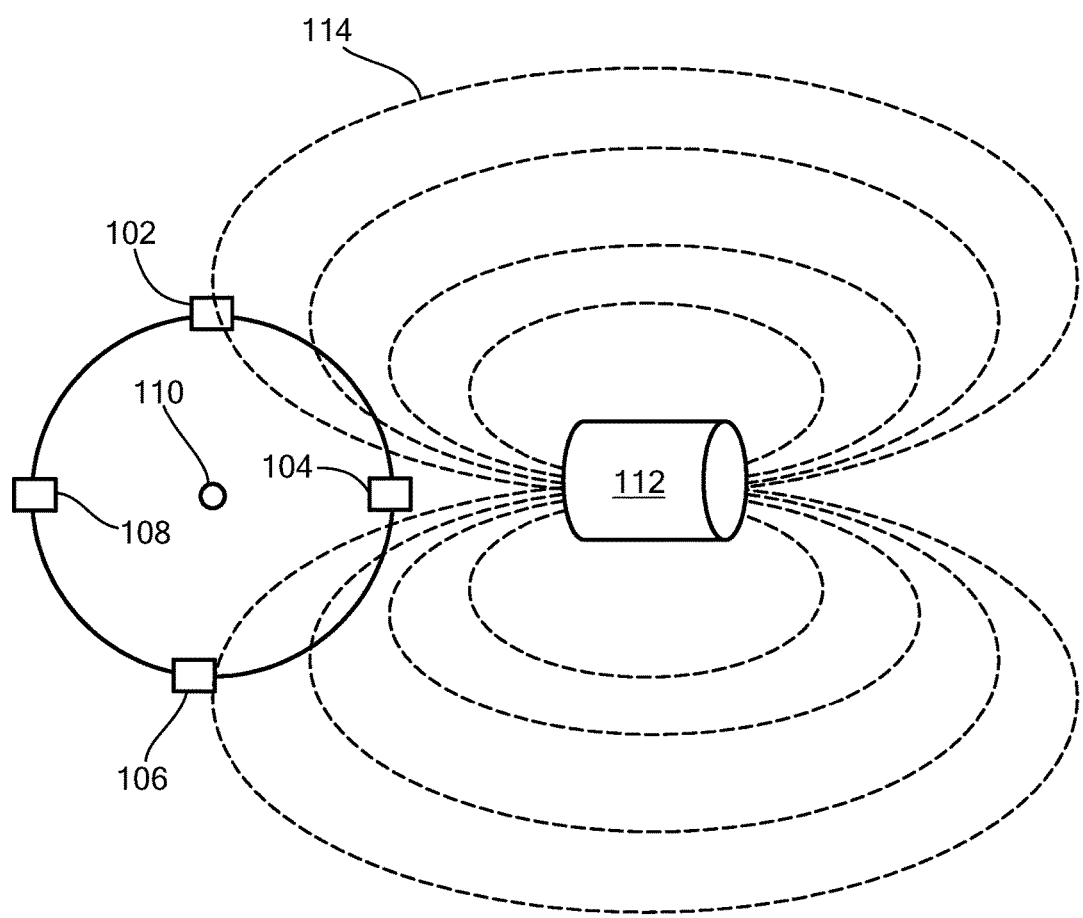
FIG. 1 is a top view of a system for detecting a magnetic target.

Before describing the present invention, some information is provided.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, a magnetic tunnel junction (MTJ), a spin-valve, etc. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR, spin-valve) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element. The target can be a hard magnet or a ferromagnetic material magnetized by an external magnet.

Referring to FIG. 1, a plurality of magnetic field sensing elements 102, 104, 106, and 108 are arranged about a center or central point 110. Magnetic field sensing elements 102-108 may be magnetoresistance elements, Hall effect elements, or a combination of magnetoresistance and Hall effect elements.

Magnetic field sensing elements 102-108 may be included as part of a magnetic field sensor configured to detect the position of magnetic target 112. Magnetic target 112 may be a permanent magnet, a ferromagnetic target magnetized by an external magnet, a hard magnet, an electromagnet, or any type of material or device that can produce a magnetic field. As discussed below, the magnetic field sensor may compute the position of magnetic target 112 by computing a barycenter of a magnetic field sensed by magnetic field sensing elements 102-108.

As shown, magnetic field sensing elements 102-108 are placed so they can detect a magnetic field produced by magnetic target 112, illustrated by magnetic field lines 114. In general, if a magnetic field sensing element is closer to magnetic target 112, then the magnetic field sensing element will be exposed to a greater magnetic field strength (e.g. a greater magnetic flux density experienced by the magnetic field sensing element) than if the magnetic field sensing element is further away from magnetic target 112. The signal produced by the magnetic field sensing element reflects the strength of the magnetic field detected by the magnetic field sensing element.

Figure 2A:
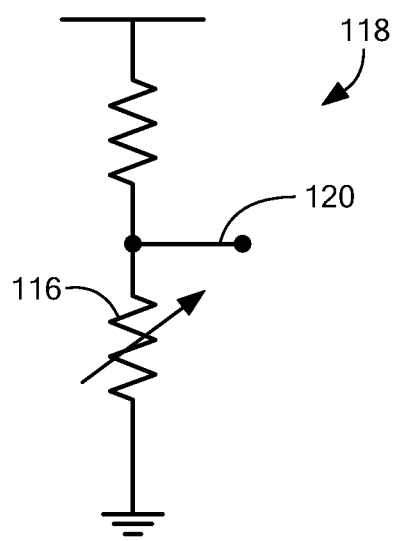
FIG. 2A is a circuit diagram of a circuit for measuring a magnetic field.

In certain embodiments, the magnetic field sensing element may operate in conjunction with other circuits or circuit elements to produce a signal representing the strength of the magnetic field. In FIG. 2A, a magnetoresistance element 116 is shown as part of a simple resistor-divider circuit 118. In the presence of no magnetic field, a resistance of the magnetoresistance element 116 is at a nominal resistance. When the circuit 118 is exposed to a relatively strong magnetic field in a first direction, the resistance of magnetoresistance element 116 may decrease and the voltage at output terminal 120 may also decrease. When the circuit 118 is exposed to a magnetic field in a second opposite direction, the resistance of magnetoresistance element 116 may increase and the voltage at output terminal 120 may increase. If the magnetoresistance element 116 is on the "top" of the resistor-divider circuit, then the voltage at the output terminal 120 will be inverted. In other embodiments, a resistor bridge circuit that includes one or more magnetoresistance elements can be used.

FIG. 1 is a two-dimensional depiction of target 112 and magnetic field sensing elements 102-108. In an actual system, the arrangement and orientation of the magnetic field sensing elements and target 112 may depend on the type of magnetic field sensing elements used, the orientation of an axis of greatest sensitivity of the magnetic field sensing elements, the orientation of the magnetic field produced by target 112, the strength of the magnetic field produced by target 112, product design and manufacturing requirements, etc. Accordingly, magnetic target 112 may be movably positioned above the magnetic field sensing elements, below the magnetic field sensing elements, to the side of the magnetic field sensing elements, or in any position or orientation so that the magnetic field 114 produced by magnetic target can be detected by magnetic field sensing elements 102-108.

Figure 2B:
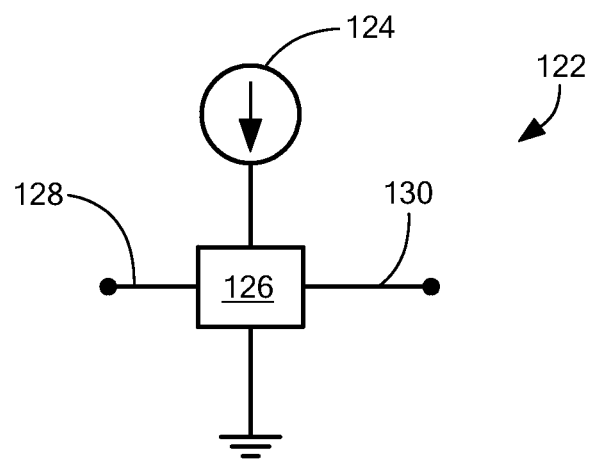
FIG. 2B is a circuit diagram of a circuit for measuring a magnetic field.

FIG. 2B shows a simple Hall effect circuit 122 that includes a current source 124 that produces a current through Hall effect element 126. When exposed to a changing external magnetic field, the voltage across the Hall effect element 126 (i.e. the voltage between terminal 128 and terminal 130) will change. In the presence of no magnetic field, voltage across the Hall element is at a nominal voltage. In an embodiment, as the strength of the magnetic field sensed by magnetic field sensing element 126 increases in a first direction, the voltage across the Hall effect element 126 also increases. As the strength of the magnetic field sensed by magnetic field sensing element 126 increases in a second opposite direction, the voltage across the Hall effect element 126 decreases.

The simple circuits shown in FIGS. 2A and 2B are shown for purposes of illustration. Other circuits that employ magnetic field sensing elements and produce a signal representing the sensed magnetic field may be employed.

The signals produced by the resistor-divider circuit 118 and the Hall effect circuit 122 in response to changes in the external magnetic field may be relatively small. Accordingly, amplifiers, filters, and/or other circuits and techniques known in the art may be used to amplify and shape the signal produced by the circuits.

Referring again to FIG. 1, magnetic field sensing elements 102-108 may be oriented along an axis of maximum sensitivity to detect the magnetic field produced by magnetic target 112. As shown in FIG. 1, magnetic field sensing elements 102-108 are arranged so that the planar surface of the magnetic field sensing elements is parallel to the magnetic field lines 114. In another embodiment, and/or if another type of magnetic field sensing element is used, the magnetic field sensing elements 102-108 may be arranged so that the planar surface of the magnetic field sensing elements is perpendicular to the magnetic field lines 114.

As magnetic target 112 moves relative to the magnetic field sensing elements 102-108, the magnetic field detected by the magnetic field sensing elements changes. For example, as shown in FIG. 1, magnetic field sensing element 104 may detect a relatively strong magnetic field because it is relatively close to magnetic target 112. Magnetic field sensing elements 102 and 106 may detect a relatively weaker magnetic field because they are further from magnetic target 112. And, magnetic field sensing element 108 may detect an even weaker magnetic field because it is furthest from magnetic target 112. Thus the signal produced by magnetic field sensing element 104 may indicate a relatively strong magnetic field, the signals produced by magnetic field sensing elements 102 and 106 may indicate a relatively weaker magnetic field, and the signal produced by magnetic field sensing element 108 may indicate a magnetic field strength that is weaker still.

However, as magnetic target 112 moves, the magnetic field sensed by the magnetic field sensing elements changes. As magnetic target 112 moves closer to magnetic field sensing element 102 and further from magnetic field sensing element 104, the signal produced by magnetic field sensing element 102 indicates a stronger magnetic field and the signal produced by magnetic field sensing element 104 indicates a weaker magnetic field. The same or similar may be true for the other magnetic field sensing elements as magnetic target 112 moves closer to or further away from the other them.

Figure 3:
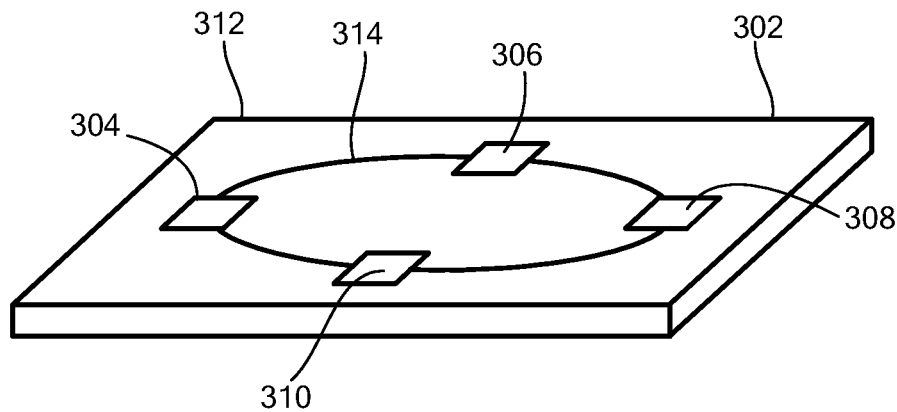
FIG. 3 is an elevated view of a magnetic field sensor.

Referring to FIG. 3, a substrate 302 includes one or more magnetic field sensing elements 304, 306, 308, and 310 disposed thereon, which may be the same as or similar to magnetic field sensing elements 102-108 in FIG. 1. Magnetic field sensing elements 304-310 may be supported on or over a top surface 312 of the substrate 302 or disposed within the top surface 312. The magnetic field sensing elements 304-310 may be formed as part of substrate 302 or may be separate elements that are positioned on or over surface 312 of substrate 302.

As shown in FIG. 3, the magnetic field sensing elements, whether formed as part of substrate 302 or positioned on or over surface 312, may be arranged in a geometric pattern. In FIG. 3, the magnetic field sensing elements 304-310 are arranged along the circumference of a circle 314. However, the magnetic field sensing elements may be arranged in an arc, in an ellipse, in a line, in a semi-circle, or in any other geometric pattern including a random pattern, etc. Any pattern may be used so long as the position of the magnetic field sensing elements is known and a barycenter of the measurements of the magnetic field produced by target 112 can be computed, as is discussed below.

In an embodiment, the substrate 302 is a silicon-based substrate that includes an integrated circuit (IC) (not shown) coupled to the magnetic field sensing elements. The integrated circuit may include other circuitry such as power circuitry, filters, circuits to drive the magnetic field sensing elements, circuits to receive the signals generated by the magnetic field sensing elements, circuits to process the signals received by the magnetic field sensing elements, etc. The integrated circuit can also include other circuits not related to the magnetic field sensing elements 304-310.

In another embodiment, the magnetic field sensing elements 304-310 may be separate from and/or separately mounted with respect to substrate 302. Although not shown, silicon substrate 302 may be packaged in an integrated circuit package. The magnetic field sensing elements may be located within the same package, on a surface of the package, in a separate package, etc.

Figure 4:
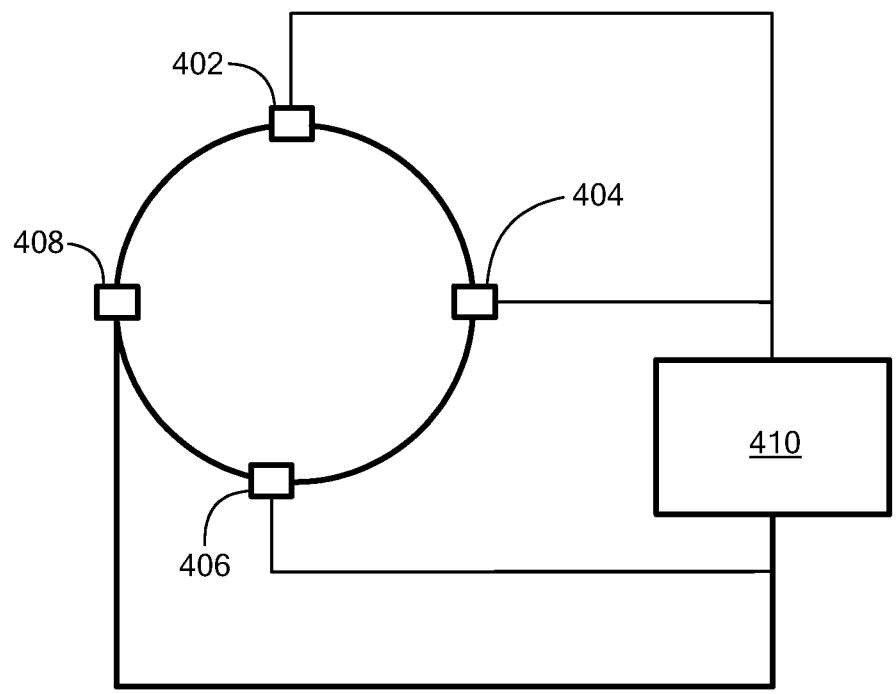
FIG. 4 is a circuit diagram of a magnetic field sensor including a processor.

Referring to FIG. 4, magnetic field sensing elements 402, 404, 406, and 408 may be the same as or similar to magnetic field sensing elements 304-310 and/or magnetic field sensing elements 102-108. As shown, magnetic field sensing elements 402-408 are coupled to a processor circuit 410 configured to receive the output signal from each one of the magnetic field sensing elements. Processor circuit 410 may be part of an integrated circuit, such as the integrated circuit described above with respect to FIG. 3. Processor circuit 410 may include circuitry to receive the signals (i.e. the measurements) from magnetic field sensing elements 401-408 representing the strength of the magnetic field, and to determine a barycenter of the measurements of the magnetic field based on the measurements and a position of the magnetic field sensing elements. The processor 410 may also determine a position of magnetic target 112 based on the computed barycenter. Analog-to-digital conversions are not explicitly shown. However, in some embodiments, either the processor 410 includes one or more analog-to digital converters or one or more analog-to digital converters are provided between the magnetic field sensing elements 402-408 and the processor 410. An example of a processor 410 can be found in U.S. Patent Application No. 2013/0179115, which is incorporated here by reference in its entirety.

Processor 410 may include circuits designed to compute the barycenter based on the signals from the magnetic field sensing elements or a general processor that can execute software instructions for computing the barycenter. Processor 410 may include a non-transient memory (such as a flash memory or ROM, for example), in which the software instructions can be stored. Processor 410 may also include circuitry to execute the software instructions. The software instructions, when executed by processor 410, may cause processor 410 to determine the location of target 112 by, for example, computing a barycenter of the signals received from magnetic field sensing elements 402-408.

Figure 5A:
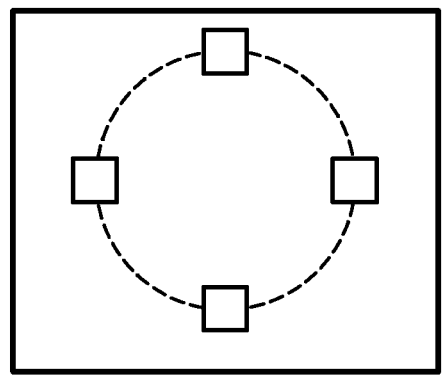
FIG. 5A, FIG. 5B, and FIG. 5C are top views of systems for detecting a magnetic target.
Figure 5B:
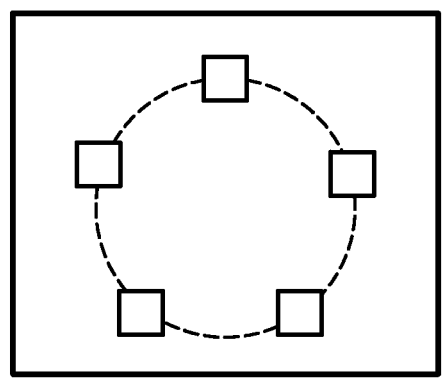
Figure 5C:
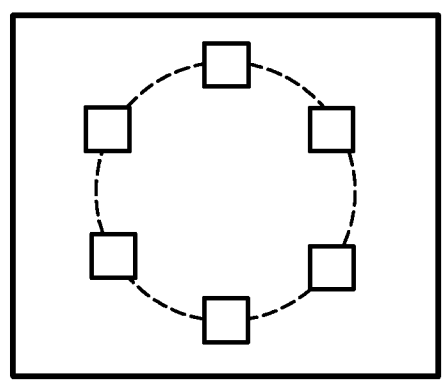

Referring to FIGS. 5A-5C, varying numbers of magnetic field sensing elements can be arranged in a geometric pattern to detect magnetic target 112. FIG. 5A shows four magnetic field sensing elements, FIG. 5B shows five magnetic field sensing elements, and FIG. 5C shows six magnetic field sensing elements arranged about the circumference of a circle. In other embodiments, more or fewer magnetic field sensing elements may be used. Regardless of the number of magnetic field sensing elements, each of the magnetic field sensing elements may be coupled to processor 410 so that processor 410 can receive the signals generated by the magnetic field sensing elements.

In FIGS. 5A-5C, the magnetic field sensing elements are arranged at equidistant intervals around the circumference of the circle. However, this is not a requirement. As described above, the magnetic field sensing elements may be arranged in a semi-circle or other geometric or non-geometric pattern, if desired.

In operation, the magnetic field sensing elements sense the magnetic field of target 112 and each produce a signal (e.g. a measurement) representing the strength of the magnetic field as sensed by the respective magnetic field sensing element. Processor 410 receives these signals and computes a barycenter of the measurements.

Figure 6:
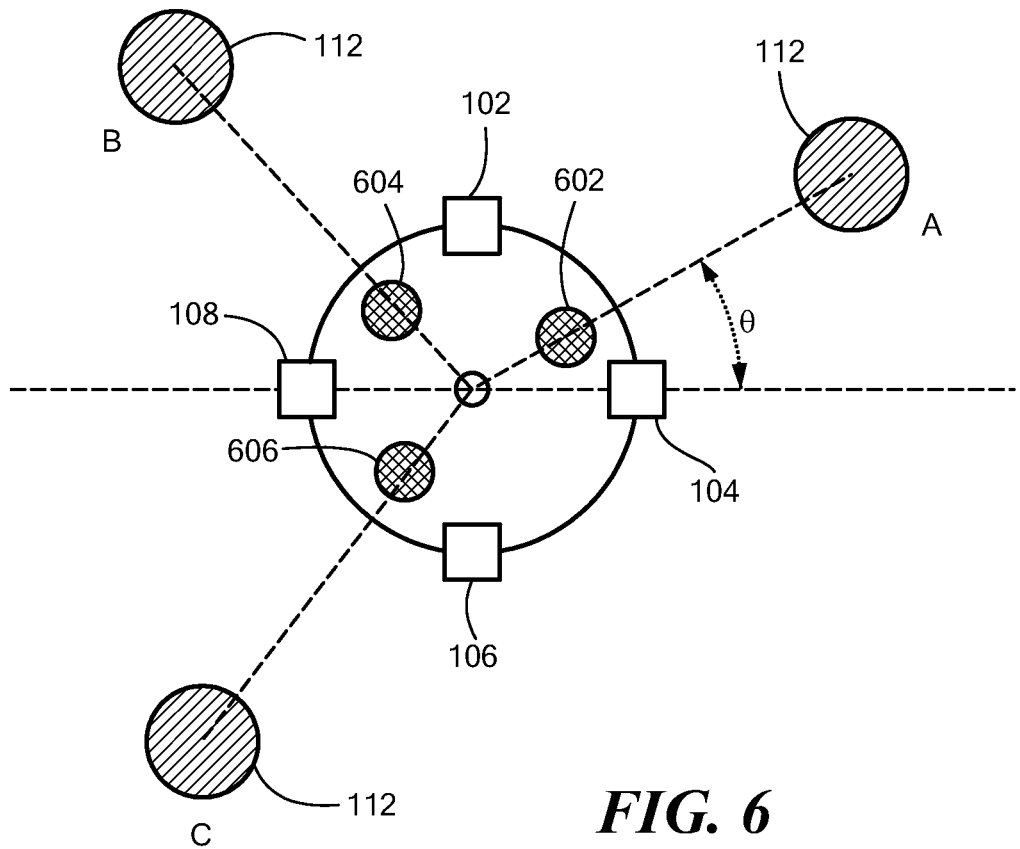
FIG. 6 is a top view of a system for detecting a magnetic target, showing the magnetic target in three positions.

Referring to FIG. 6, in which like elements of FIG. 1 are shown having like reference designations, an overhead view of magnetic field sensing elements 102-108 includes magnetic target 112 shown in three positions (positions A, B, and C). In the embodiment shown, the position of each of magnetic field sensing elements 102-108 is fixed with respect to the other magnetic field sensing elements. Thus, each magnetic field sensing element can be assigned a coordinate position. Assuming, for example, that the page represents a Cartesian plane, each magnetic field sensing element has an X position (e.g. a horizontal coordinate) and a Y position (e.g. a vertical coordinate). One skilled in the art will recognize that, in this example, the magnetic field sensing elements 102-108 are arranged in the same plane. This, however, is not a requirement. The magnetic field sensing elements 102-108 can be arranged in a two-dimensional, planar, configuration, or can be arranged in three dimensions. As long as the position of the magnetic field sensing elements 102-108 is known, processor 410 can determine a barycenter of the measurements received from the magnetic field sensing elements.

The barycenter is a weighted average of the magnetic field measurements. For example, the position of each magnetic field sensing element (which can be represented by a vector in the Cartesian plane or in another coordinate system) may be weighted (e.g. multiplied) by the strength of the magnetic field as sensed by that particular magnetic field sensing element. These weighted vectors may then be summed or averaged to find the barycenter. In an embodiment, to determine the barycenter of the magnetic field measurements, processor 410 of FIG. 4 may use the following, general formula:

$$\sum_{i=1}^{n} H_i \cdot \overrightarrow{GE_i} = \vec{0} \quad (1)$$

In the formula HiGEi is a weighted position vector where n is the number of magnetic field sensing elements, $H_i$ is the strength of the magnetic field as detected by each magnetic field sensing element i, G is the position of the barycenter, $E_i$ is the position or coordinates of each magnetic field sensing element, and GEi is a vector between the position of the barycenter and the magnetic field sensing element i. In an embodiment, $H_i$ is a scalar value and $GE_i$ is a vector. $H_i$ may act as to provide "weight" to the position vector. Assume, for example, that magnetic field sensing element i experiences a magnetic field having a greater strength than experience by magnetic field sensing element i+1. In this example, $H_i$ will be greater than $H_{i+1}$. Therefore $H_i$ will provide relatively greater weight to position vector $GE_i$ in the summation in formula (1), and $H_{i+1}$ will provide relatively less weight to position vector $GE_{i+1}$.

To determine the X coordinate of the barycenter, processor 410 may use the following formula:

$$X_G = \frac{\sum_{i=1}^{n} H_i X_{Ei}}{\sum_{i=1}^{n} H_i} \quad (2)$$

In equation (2), $X_G$ is the x-coordinate of the barycenter and $X_{Ei}$ is the x-coordinate of each magnetic field sensing element i.

To determine the Y coordinate of the barycenter, processor 410 may use the following formula:

$$Y_G = \frac{\sum_{i=1}^{n} H_i Y_{Ei}}{\sum_{i=1}^{n} H_i} \quad (3)$$

In equation (3), $Y_G$ is the y-coordinate of the barycenter and $Y_{Ei}$ is the y-coordinate of each magnetic field sensing element i.

Processor 410 may also compute an angle of displacement of the barycenter. For example, in FIG. 6, when magnetic target is in position A, magnetic target (and the barycenter of the magnetic field measurements) will have an angle θ with respect to the horizontal axis. Processor 410 may use the following formula to compute the angle θ:

$$\theta = a\tan2\left(\sum_{i=1}^{n} H_i Y_{Ei}, \sum_{i=1}^{n} H_i X_{Ei}\right) \quad (4)$$

Assuming, as shown in FIG. 6, that magnetic field sensing elements 102-108 are equidistant and around the circumference of a circle, formula (4) may be reduced to the following formula:

$$\theta = a\tan2\left(\sum_{i=1}^{n} H_i \sin\left(2\pi\left(\frac{i-1}{n}\right)\right), \sum_{i=1}^{n} H_i \cos\left(2\pi\left(\frac{i-1}{n}\right)\right)\right) \quad (5)$$

The angle of the barycenter will generally follow the angle of the magnetic target 112. For example, when magnetic target 112 is in position A, a computed barycenter 602 will have the same angle as magnetic target 112 with respect to a reference angle, such as the angle of the horizontal axis. Similarly, when magnetic target 112 is in position B, the computed barycenter 604 will have the same angle as magnetic target 112; and when magnetic target 112 is in position C, the computed barycenter 606 will have the same angle as magnetic target 112. In general, for any position of magnetic target 112, processor 410 can compute the angle of the magnetic target with respect to the horizontal axis (or with respect to an alternate reference) by computing the barycenter and the angle of the barycenter with respect to the horizontal axis (or with respect to the alternate reference).

Figure 7:
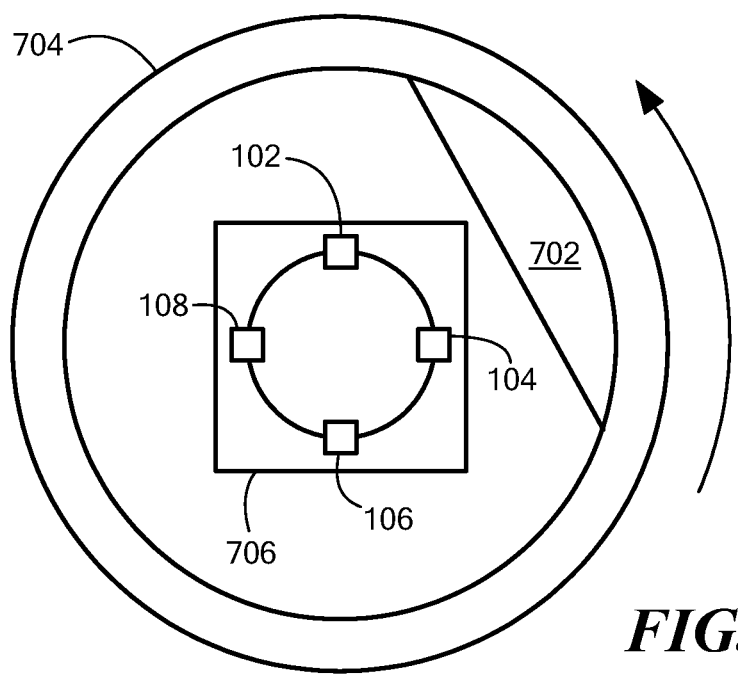
FIG. 7 is a top view of a system for detecting a magnetic target, showing the magnetic target mounted on a rotating member.

FIG. 7, in which like elements of FIG. 1 are shown having like reference designations, is a top view of an application for detecting the angle of a magnetic target 702. Magnetic target 702 is mounted to a rotating member 704 in a position relative to magnetic field sensing elements 102-108. Rotating member 704 may be a gear, a rotating shaft, rotating pipe, a wheel, or any other element of machinery that can rotate. Examples include automotive camshafts, brake rotors, conveyer belts and robotic manufacturing machinery, etc. If rotating member 704 is a gear or wheel, magnetic target 702 may be mounted on a side of the gear or wheel. If rotating member 704 is a shaft or pipe, magnetic target 702 may be mounted on an end of the wheel or pipe, or on an inner surface of the pipe. In other embodiments, rotating member 704 may oscillate or rotate back and forth without making a full rotation, mounted on a mechanical arm, or mounted in any way that allows magnetic target 702 to move with respect to magnetic field sensing elements 102-108. In general, magnetic target 702 may be mounted in any way that allows the angle of magnetic target 702 to change with respect to the magnetic field sensing elements 102-108. In other embodiments, magnetic target 702 may be stationary and magnetic field sensing elements 102-108 may rotate or move with respect to magnetic target 702.

As noted above, magnetic field sensing elements 102-108 may be part of a magnetic field sensor (e.g. magnetic field sensor 706) that also includes a processor such as processor 410 shown in FIG. 4. As magnetic target 702 moves or rotates with respect to magnetic field sensing elements 102-108, magnetic sensor 706 may detect the location of magnetic target 702. Magnetic sensor 706 may cause the magnetic field sensing elements to periodically measure the strength of the magnetic field produced by magnetic target 702. Processor 410 may then compute the angle of magnetic target 702 by, for example, using the formulas above. Magnetic sensor 706 may periodically or continuously measure and compute the angle of magnetic target 702 as magnetic target 702 moves.

Figure 7B:
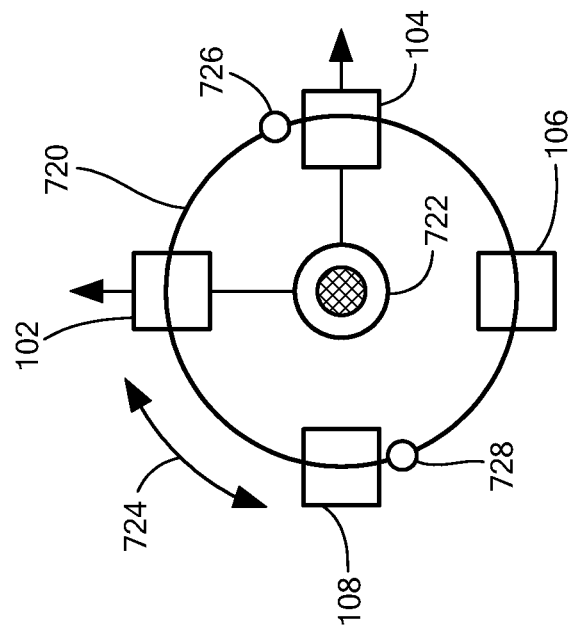
FIG. 7B is a top view of a system for detecting a magnetic target.
Figure 7A:
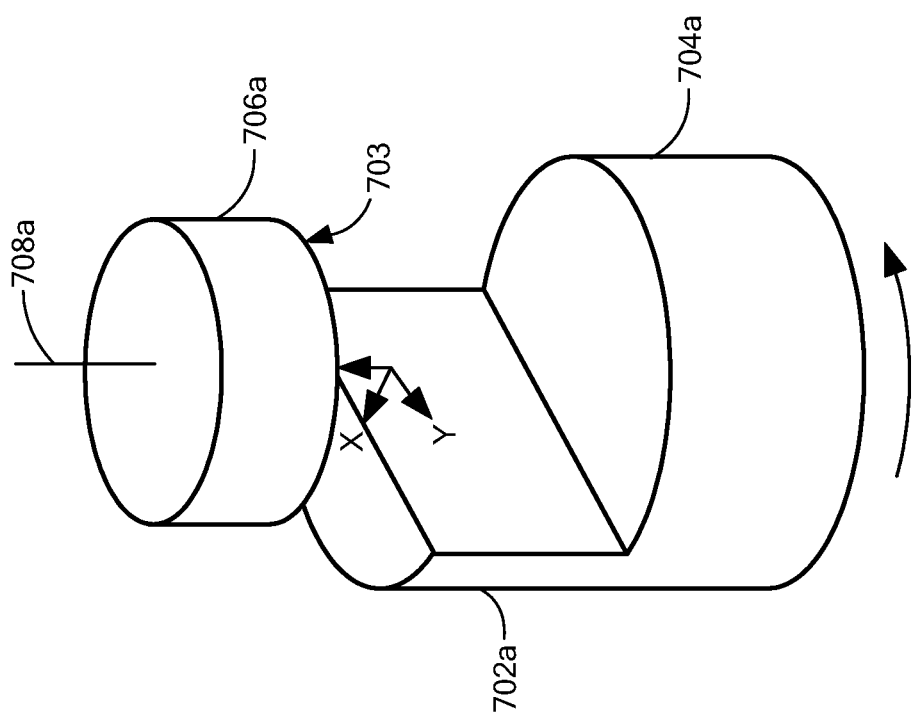
FIG. 7A is a perspective view of a system for detecting a magnetic target.

FIG. 7A is a perspective view of an application for detecting the angle of a target 704a. Magnetic target 704a may include a protrusion 702a that can be sensed by magnetic field sensing elements 102-108. The protrusion may be offset from a center point and/or axis of rotation of magnetic target 704a. Back bias magnet 706a may be positioned adjacent to a substrate that supports magnetic field sensing elements 102-108. The substrate may be positioned on a bottom surface 703 of back bias magnet 706a and arranged in a geometric pattern, such as a circle or other pattern, as described above.

The presence of protrusion 702a may result in magnetic target 704a producing a non-symmetrical magnetic field at or near the magnetic field sensing elements. Thus, as target 704a rotates, magnetic field sensing elements 102-108 may measure a relatively stronger or relatively weaker magnetic field based on the proximity of protrusion 702a to each respective magnetic field sensing element 102-108. The magnetic field measurements produced by magnetic field sensing elements 102-108 may then be used to determine the angular position of protrusion 702a using techniques as described above.

FIG. 7A is an example of a so-called end-of-shaft application, where the magnetic target may be a shaft or placed at the end of a shaft. In such embodiments, the center point between the magnetic field sensing elements (e.g. center point 110 in FIG. 1) may be a point on the axis of rotation 708a of magnetic target 704a.

FIG. 7B is a top view of an application for detecting the angle of a magnetic target 720. Magnetic target 720 may be configured to rotate about a central point 722 in the directions shown by 724, for example. In an embodiment, the north and south poles of magnetic target 720 may be on opposite sides of magnetic target 720 and in a plane defined by the page. For example, the south pole of magnetic target 720 may be located at or near point 726 and the north pole of magnetic target 720 may be located at or near point 728.

Magnetic field sensors 102-108 may, as described above, be part of a magnetic field sensor circuit, which may be configured to determine the angle of rotation of target 720. Magnetic field sensors 102-108 may be arranged in a plane that is substantially parallel to the plane defined by north pole 728, south pole 726, and the page.

As magnetic target 720 rotates, the north pole 728 and sound pole 726 will also rotate with respect to the magnetic field sensing elements 102-108. Thus, as magnetic target 720 rotates, the magnetic field detected by each of the magnetic field sensing elements will change. For example, assume that the axis of maximum sensitivity for each magnetic field sensing element 102-108 is aligned so that the magnetic field sensing element has maximum response to the north pole 728 (when north pole 728 is close to the respective magnetic field sensing element) and has minimum response to the south pole 726 (when south pole 726 is close to the respective magnetic field sensing element). In such an embodiment, the signal produced by each magnetic field sensing element 102-108 may be at a maximum value when north 728 is aligned with the magnetic field sensing element and at a minimum value when south pole 728 is aligned with the magnetic field sensing element. Thus, as magnetic target 720 rotates, the signal produced by each magnetic field sensing element may be a sinusoidal (or other type of cyclical) signal. Also, the signals produced by magnetic field sensing elements 102-108 will be out of phase with each other as magnetic target 720 rotates. At any point in time, a barycenter may be computed from these signals to determine the angular position of magnetic target 720 (e.g. the angular position of the north or south pole of magnetic target 720).

Figure 8:
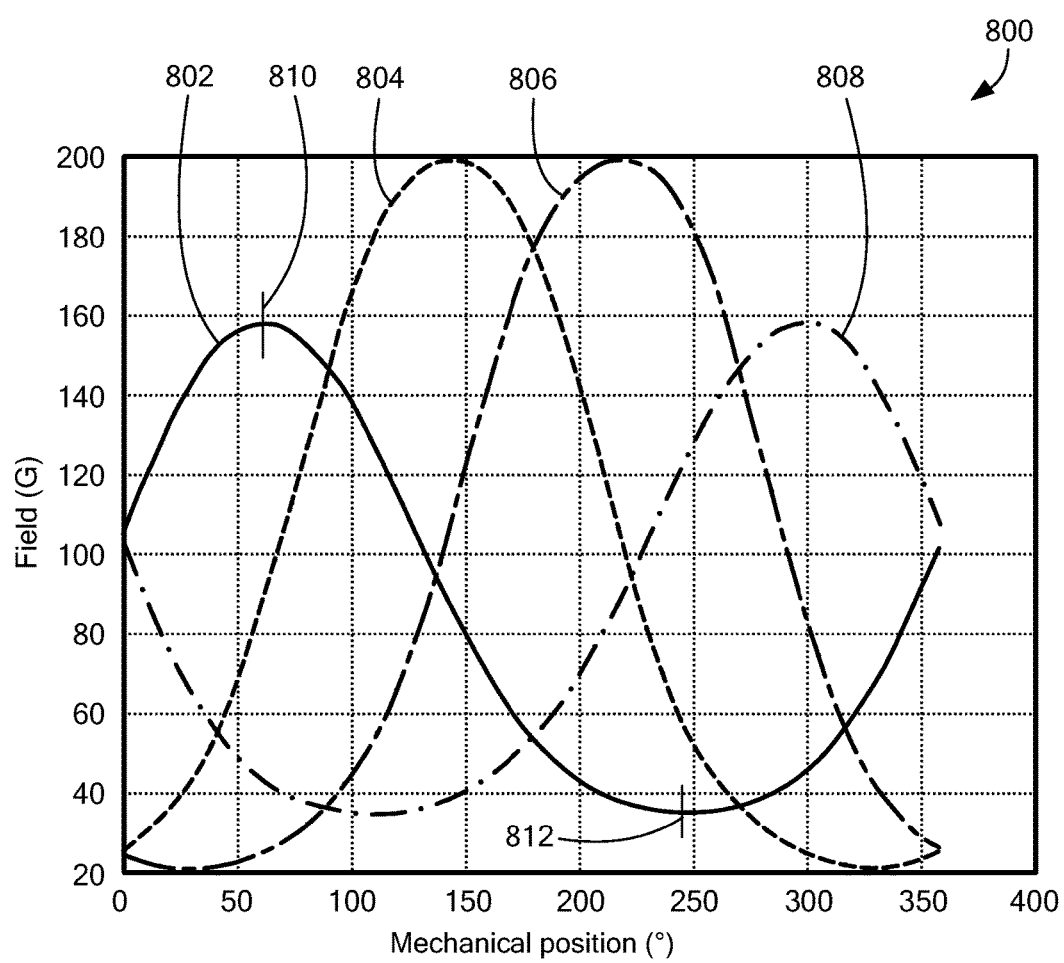
FIG. 8 is a graph of waveforms representing magnetic field strength.

Referring to FIG. 8, a graph 800 shows four waveforms 802-808 representing output signals from magnetic field sensing elements 102-108, respectively. In the graph, the vertical axis represents the detected strength of the magnetic field and the horizontal axis represents the angular position of magnetic target 702 (and/or magnetic target 702a or 720. Graph 800 depicts, in waveforms 804-810, the detected magnetic field strength as magnetic target 702 rotates three hundred sixty degrees around the magnetic field sensing elements 102-108 as shown, for example, in FIGS. 7, 7A, and/or 7B. Although the amplitudes of waveforms 802 and 808 are smaller than the amplitudes of waveforms 804 and 806, one skilled in the art will recognize that in other embodiments, the amplitudes of waveforms 802 and 808 may be the same as or greater than the amplitudes of waveforms 804 and 806 depending upon circuit or mechanical system designs.

In FIG. 8, the amplitudes of waveforms 802 and 808 are less than the amplitudes of waveforms 804 and 806. This difference in amplitude may be due to mechanical tolerances of the system from which waveforms 802-808 were measured. In an embodiment of an ideal system, the amplitudes of all the waveforms may be the same, and in other embodiments and other real-world systems, the amplitudes of the waveforms may vary from what is shown in FIG. 8.

As seen in FIG. 8, the detected magnetic field strength rises and falls as magnetic target 702 rotates. Using waveform 802 as an example, waveform 802 has a peak 810 at about sixty degrees. This may correspond to the angular position where magnetic target 702 is closest to magnetic field sensing element 102. As magnetic target 702 rotates from sixty degrees to two hundred forty degrees, the magnetic field as detected by magnetic field sensing element 102 falls, following a roughly sinusoidal pattern until it reaches a minimum at about two hundred forty degrees. At this point, magnetic target 702 may be at its greatest distance from magnetic field sensing element 102 along the path of rotation. As target 702 continues to rotate, the distance between magnetic target 702 and magnetic field sensing element 102 again decreases and the strength of the detected magnetic field increases, as shown by the rise of waveform 802.

The other waveforms 804-808 have similar sinusoidal patterns, but are out of phase with each other. Because the magnetic field sensing elements 102-108 are placed ninety degrees apart as shown in FIG. 7, each waveform is ninety degrees out of phase with the preceding waveform. In other embodiments, if the magnetic field sensing element are placed in other patterns or positions, the shapes and phases of the waveforms are different, accordingly. Even if the waveforms are not regular sinusoids like those shown in FIG. 8, so long as the position of the magnetic field sensing elements 102-108 is known, appropriate formulas, the same as or similar to equations above, can be used to detect the position of magnetic target 702.

Figure 9:
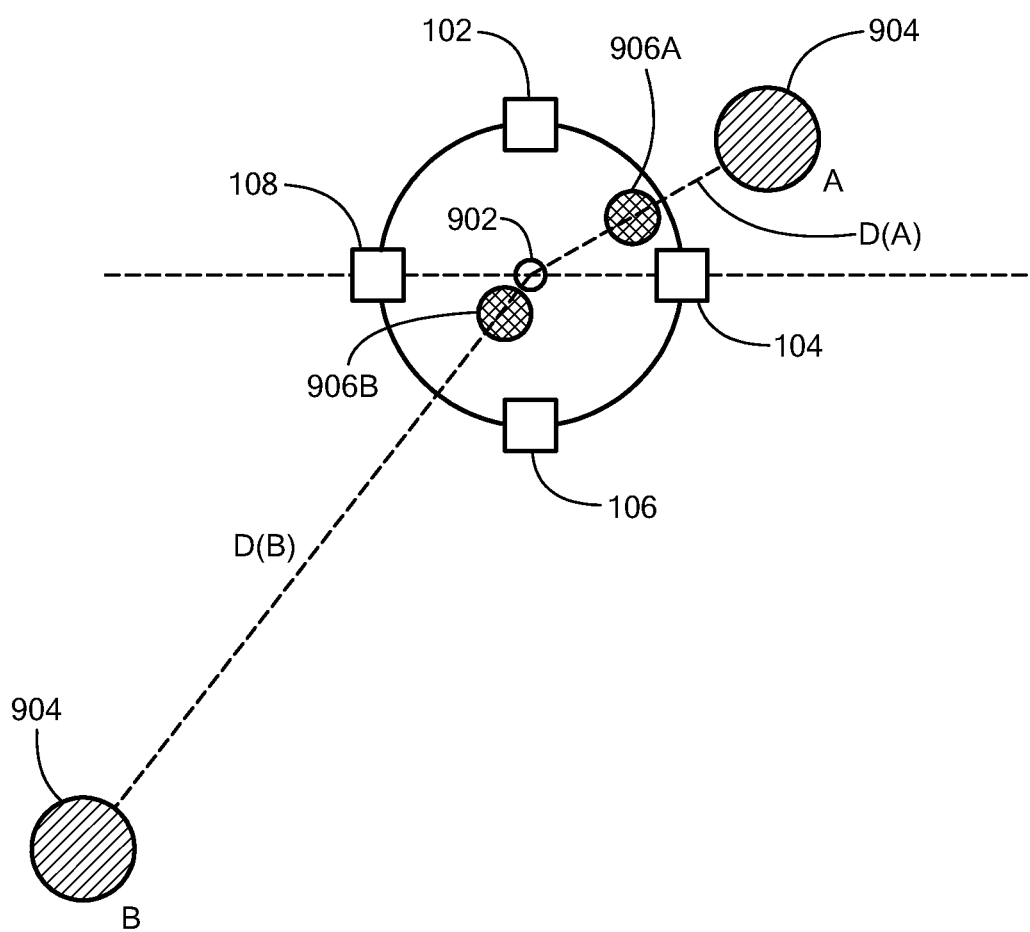
FIG. 9 is a top view of a system for detecting a magnetic target, showing the magnetic target in two positions.

Referring to FIG. 9, the barycenter of the detected magnetic fields can be used to determine the magnetic target's radial distance from a center point 902. In position 'A', the distance between magnetic target 904 and center point 902 is relatively small. Accordingly, the distance between computed barycenter 906A and center point 902 is relatively large, due to the magnetic field sensing elements 102-102 sensing a relatively strong magnetic field when target 904 is close. When magnetic target 904 moves to position 'B', the distance between magnetic target 904 and center point 902 is relatively large. Accordingly, the distance between computed barycenter 906B and center point 902 is relatively small, due to the magnetic field sensing elements 102-108 sensing a relatively weak magnetic field when target 904 is farther away. Once $X_G$ and $Y_G$ are known, the distance between the barycenter and the center point 902 can be computed using the $X_G$ and $Y_G$ position of the barycenter as shown above in formulas (2) and (3). The distance D between the target 904 and center point 902 is inversely proportional to the distance from the computed barycenter to center point 902, as illustrated by formula (6).

$$D \propto \frac{1}{\sqrt{X_G^2 + Y_G^2}} \quad (6)$$

In formula (6), D represents the distance between the magnetic target and center point 902, X represents the distance in the X axis between the barycenter and center point 902, and Y represents the distance in the Y axis between the barycenter and center point 902.

As described by formula (6), distance D(A) in FIG. 9 is inversely proportional to the distance between barycenter 906A and center point 902, and distance D(B) is inversely proportional to the distance between barycenter 906B and center point 902. The distance of the magnetic target 902 from the center point can be derived from the distance D of the barycenter from the center point, because the distance D of the barycenter is inversely proportional to or related to the distance of the magnetic target 902.

Figure 10:
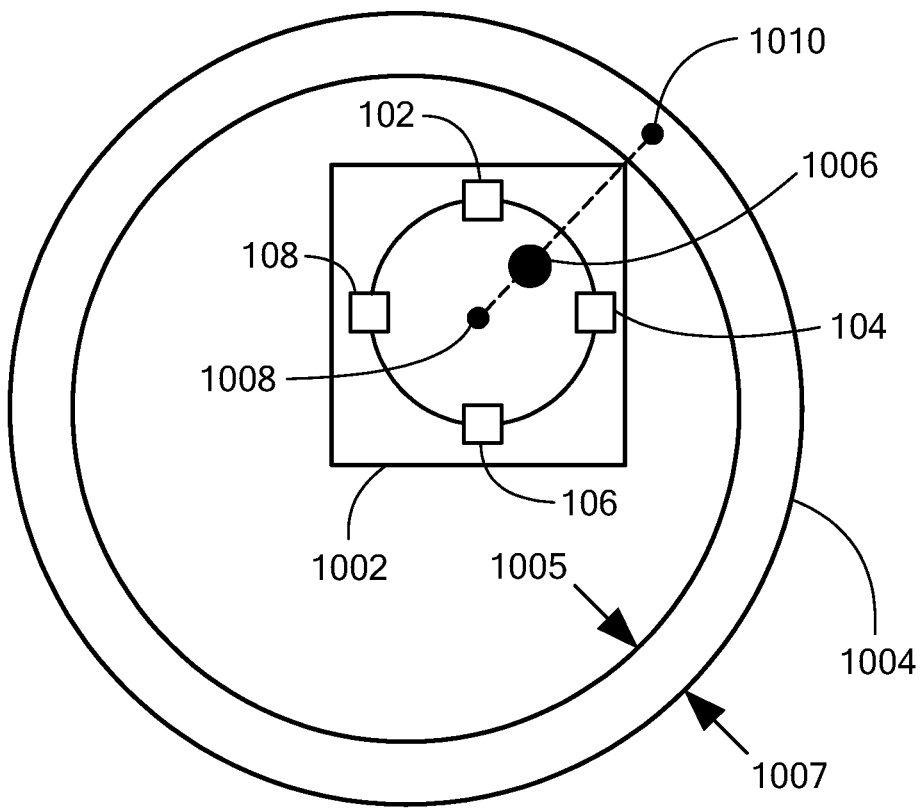
FIG. 10 is a top view of a system for detecting a ring-shaped magnetic target.

Referring to FIG. 10, in which like elements of FIG. 1 are shown having like reference designation, a magnetic field sensor 1002 that includes magnetic field sensing elements 102-108 and a processor (not shown) configured to compute barycenter 1006 may be used in a joystick application. In such an embodiment, the joystick may include a ring-shaped magnetic target 1004, though other types of magnetic targets such as magnetic bars, a magnetic cone, or partial rings, may also be used in a joystick application. Magnetic target 1004 may be a hard magnet or a ferromagnetic target, as described above.

The plane defined by ring-shaped magnetic target 1004 may be substantially parallel to the plane defined by the magnetic field sensing elements. In embodiments, the magnetic field sensing elements may be positioned with respect to target 1004 so that the magnetic field sensing elements lie within the inner circumference 1005 and/or the outer circumference 1007 of magnetic target 1004.

If the joystick is in a central position, magnetic target 1004 may be centered on magnetic field sensor 1002. As a user manipulates the joystick, target 1004 may move so that one point along magnetic target 1004 is closest to center point 1008. As an example, point 1010 is closest to center point 1008 in FIG. 10.

Because magnetic target 1004 (and point 1010) is relatively close to magnetic field sensing elements 102 and 104 and relatively far from magnetic field sensing elements 106 and 108, the magnetic field detected by magnetic field sensing elements 102 and 104 will be greater than the magnetic field detected by magnetic field sensing elements 106 and 108. Thus, the computed position of the barycenter 1006 will "point" to closest point 1010 of magnetic target 1004. The computed X and Y positions of the barycenter can be used to indicate the position and offset of the joystick from the center position. Alternatively, the computed angle θ of the barycenter 1006 can be used to indicate the angle that a user has pushed the joystick, and the distance D from center point 1008 to barycenter 1006 can be used to indicate the relatively offset from the joystick's center position.

Figure 11:
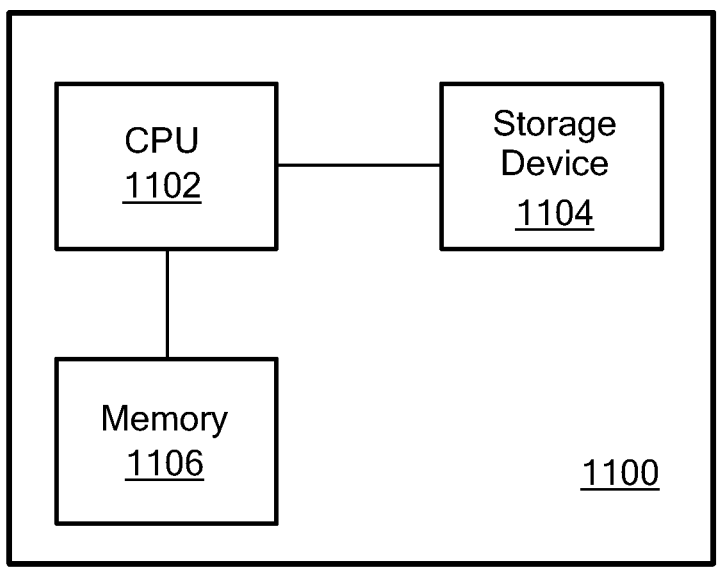
FIG. 11 is a block diagram of a processor.

FIG. 11 is a block diagram of a computational circuit 1100 that can perform some or all of the processing described above. For example, computational circuit 1100 may receive the magnetic field strength measurements from magnetic field sensing elements 102-108 and compute the barycenter using some or all of the techniques and formulas above. In an embodiment, processor 410 may be the same as or similar to computational circuit 1100. In other embodiments, processor 410 may be a custom computational and/or logic circuit that can perform at least some of the functions described above.

Computational circuit 1100 may include a central processing unit (CPU) 1102 coupled to a storage device 1104 and a memory 1106. CPU 1102 can be a general purpose processor, a custom-designed processor, a microprocessor, or any other type of processor or circuit that can execute software instructions.

Storage device 1104 comprises a non-volatile memory such as a ROM, flash memory, F-RAM, solid-state drive, EPROM, EEPROM, and the like. Storage device 1104 may be either read-only or read/write. In other embodiments, storage device 1104 is a hard-drive, DVD, CD, or other type of disc device.

Memory 1106 comprises a volatile memory, such as a RAM. In certain embodiments, RAM 1106 may be omitted from computational circuit 1100.

In operation, CPU 1102 may read and execute software instructions from storage device 1104 and/or memory 1106. When executed, the instructions may cause CPU 1102 to perform functions and operations as described above with respect to processor 210. In certain embodiments, CPU 1102 may copy the instructions from storage device 1104 to memory 1106 prior to executing the instructions. CPU 1102 may also read and write data to and from storage device 1104 and memory 1106. In other embodiments, computational circuit may comprise programmable hardware logic (e.g. a PLA), an FPGA, an ASIC, or any other type of hardware circuit or device capable of performing at least some of the functions described above and/or executing software instructions that cause the computational circuit to perform at least some of the functions described above. Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited herein are hereby incorporated herein by reference in their entirety.

What is claimed is:

1. A system comprising:
a plurality of magnetic field sensing elements arranged about a central point, each one of the plurality of magnetic field sensing elements configured to measure a magnetic field produced by a magnetic target and provide a respective output signal that represents a respective measurement of a strength of the magnetic field; and
a processor circuit coupled to receive the output signal from each one of the plurality of magnetic field sensing elements and determine a barycenter of the measurements of the magnetic field based on a position of the magnetic field sensing elements, wherein determining the barycenter includes calculating a two-dimensional position of the barycenter that represents a two-dimensional position of the magnetic target in a plane defined by the magnetic field sensing elements.

2. The system of claim 1 wherein the magnetic field sensing elements are arranged along the circumference of a circle about the central point.

3. The system of claim 2 wherein the magnetic field sensing elements are equidistant from adjacent magnetic field sensing elements along the circumference of the circle.

4. The system of claim 1 wherein the magnetic field sensing elements are disposed in or over a surface of a die.

5. The system of claim 4 wherein the processor circuit is disposed on the die.

6. The system of claim 1 wherein the processor is configured to determine an offset angle of the magnetic target relative to a reference position.

7. The system of claim 1 wherein the processor is configured to determine a distance of the magnetic target to the central point.

8. The system of claim 1 wherein the plurality of magnetic field sensing elements comprises three or more magnetic field sensing elements.

9. The system of claim 1 wherein the processor is configured to compute the barycenter by summing a plurality of weighted position vectors, each respective weighted position vector in the plurality of weighted position vectors including a respective magnitude representing a respective strength of the measured magnetic field and a respective position of a respective one of the plurality of magnetic field sensing elements.

10. The system of claim 9, further comprising a storage device coupled to the processor, wherein the position of each magnetic field elements is stored as data in the storage device.

11. The system of claim 1 wherein the magnetic target is a rotating target and the central point is a point on an axis of rotation of the rotating target.

12. The system of claim 1 wherein the magnetic target is a ring-shaped magnetic target and a plane defined by the ring-shaped magnetic target is substantially parallel to a plane defined by the magnetic field sensing elements.

13. The system of claim 12 wherein the magnetic field sensing elements are positioned within a circumference of the ring-shaped magnetic target.

14. The system of claim 1 wherein the magnetic target comprises a protrusion offset from an axis of rotation of the magnetic target.

15. A method of detecting position of a magnetic target comprising:
measuring, by each one of a plurality of magnetic field sensing elements arranged about a central point, a magnetic field produced by a magnetic target;
providing, by each one of the plurality of magnetic field sensing element, a respective output signal that represents a respective measurement of a strength of the magnetic field; and
determining, by a processor circuit coupled to receive the output signal from each one of the plurality of magnetic field sensing elements, a barycenter of the measurements of the magnetic field, wherein determining the barycenter includes calculating a two-dimensional position of the barycenter that represents a two-dimensional position of the magnetic target in a plane defined by the magnetic field sensing elements.

16. The method of claim 15 wherein the magnetic field sensing elements are arranged along a circumference of a circle about the central point.

17. The method of claim 16 wherein the magnetic field sensing elements are equidistant from adjacent magnetic field sensing elements along the circumference of the circle.

18. The method of claim 15 wherein the magnetic field sensing elements are disposed in or over a surface of a die.

19. The method of claim 18 wherein the processor circuit is disposed on the die.

20. The method of claim 15 further comprising determining, by the processor, an offset angle of the magnetic target relative to a reference position.

21. The method of claim 15 further comprising determining, by the processor, a distance of the magnetic target to the central point.

22. The method of claim 15 further comprising receiving, by the processor, at least three output signals from the magnetic field sensing elements.

23. The method of claim 15 further comprising computing the barycenter by summing a respective plurality of position vectors, each respective position vector in the plurality of position vectors including a respective magnitude representing a respective strength of the measured magnetic field and a respective direction representing a respective position of a respective one of the plurality of magnetic field sensing elements.

24. A system comprising:
a plurality of magnetic field sensing elements arranged on a die about a central point, each one of the plurality of magnetic field sensing elements configured to measure a magnetic field produced by a magnetic target and provide a respective output signal that represents a respective measurement of a strength of the magnetic field;
a processor circuit coupled to receive the output signals from each one of the plurality of magnetic field sensing elements and configured to:
calculate a respective weighted position vector for each magnetic field sensing element, each respective weighted position vector including a respective magnitude representing a respective strength of the measured magnetic field and a respective position of a respective one of the plurality of magnetic field sensing elements;
calculate a barycenter comprising summing the weighted position vectors;

calculate an offset angle of the magnetic target with respect to a reference position by calculating an offset angle of the barycenter with respect to the reference position; and calculate a distance of the magnetic target from the central point by calculating a distance of the barycenter from the central point;

wherein calculating the barycenter includes calculating a two-dimensional position of the barycenter that represents a two-dimensional position of the magnetic target in a plane defined by the magnetic field sensing elements.

\* \* \* \* \*

UNITED STATES PATENT AND TRADEMARK OFFICE
CERTIFICATE OF CORRECTION

PATENT NO.        : 9,797,746 B2                                    Page 1 of 1
APPLICATION NO.   : 14/580814
DATED             : October 24, 2017
INVENTOR(S)       : Yannick Vuillermet et al.

It is certified that error appears in the above-identified patent and that said Letters Patent is hereby corrected as shown below:

In the Specification

Column 4 Lines 36-37: add --target 112-- after magnetic

Column 4 Line 45: add --effect-- after Hall

Column 5 Line 35: remove "other"

Column 6 Line 27: replace "to digital" with --to-digital--

Column 7 Lines 15-16: remove the "," after planar

Column 7 Line 50: "experience" should read --than experienced--

Column 8 Line 16: both instances of "target" should read --target 112--

Column 10 Line 28: "or 720." should read --or 720).--

Column 11 Line 2: "element" should read --elements--

Column 11 Line 17: replace "102-102" with --102-108--

Column 12 Line 23: "relatively" should read --relative--

Column 13 Line 3: replace "that that" with --that the--

In the Claims

Column 13 Line 56 Claim 10: replace "elements" with --sensing element--

Signed and Sealed this
First Day of May, 2018

Andrei Iancu
*Director of the United States Patent and Trademark Office*